(12) United States Patent
Shih

(10) Patent No.: US 7,238,624 B2
(45) Date of Patent: Jul. 3, 2007

(54) SYSTEM AND METHOD FOR MANUFACTURING SEMICONDUCTOR DEVICES USING A VACUUM CHAMBER

(75) Inventor: Jen-Chieh Shih, Yongkang (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 11/069,177

(22) Filed: Mar. 1, 2005

(65) Prior Publication Data

US 2006/0199388 A1 Sep. 7, 2006

(51) Int. Cl.
*H01L 21/31* (2006.01)

(52) U.S. Cl. .................. 438/763; 438/761; 438/952; 438/948; 438/949; 438/950

(58) Field of Classification Search ................ 438/761, 438/763, 942, 948, 949, 950, 952
See application file for complete search history.

(56) References Cited

U.S. PATENT DOCUMENTS

| | | | | |
|---|---|---|---|---|
| 5,830,990 | A * | 11/1998 | Rahman | 528/482 |
| 6,187,506 | B1 * | 2/2001 | Ding et al. | 430/271.1 |
| 6,268,108 | B1 * | 7/2001 | Iguchi et al. | 430/271.1 |
| 6,509,141 | B2 | 1/2003 | Mullee | |
| 6,556,280 | B1 | 4/2003 | Kelsey et al. | |
| 6,565,764 | B2 | 5/2003 | Hiraoka et al. | |
| 6,656,666 | B2 | 12/2003 | Simons et al. | |
| 6,676,757 | B2 * | 1/2004 | Kitano et al. | 118/676 |
| 6,713,236 | B2 | 3/2004 | Chen | |
| 6,781,670 | B2 | 8/2004 | Krautschik | |
| 6,788,477 | B2 | 9/2004 | Lin | |
| 6,800,415 | B2 * | 10/2004 | Lu et al. | 430/270.1 |
| 6,838,229 | B2 * | 1/2005 | Washio et al. | 430/324 |
| 7,033,728 | B2 * | 4/2006 | Dammel | 430/270.1 |
| 7,081,943 | B2 * | 7/2006 | Lof et al. | 355/30 |
| 7,094,521 | B2 * | 8/2006 | Endo et al. | 430/322 |
| 2001/0055731 | A1 * | 12/2001 | Irie | 430/313 |
| 2004/0265747 | A1 | 12/2004 | Medeiros et al. | |
| 2006/0093959 | A1 * | 5/2006 | Huang et al. | 430/270.1 |
| 2006/0098297 | A1 * | 5/2006 | Van Peski et al. | 359/642 |

OTHER PUBLICATIONS

Bok, Edward, et al., "Supercritical Fluids for Single Wafer Cleaning", Solid State Technology, Jun. 1992, pp. 117-120.
Hayduk, Eric, et al., "Characterization of Supercritical $CO_2$ Developable Photoresists for Non-Wetting Surfaces", National Nanofabrication Users Network, Research Accomplishments 1998, pp. 11-12.
Zhang, Xiaogang, et al., "Chemical-Mechanical Photoresist Drying in Supercritical Carbon Dioxide with Hydrocarbon Surfactants", J. Vac. Sci. Technol. B 22(2), Mar./Apr. 2004, pp. 818-825.

* cited by examiner

*Primary Examiner*—Zandra V. Smith
*Assistant Examiner*—Christy Novacek
(74) *Attorney, Agent, or Firm*—Haynes and Boone, LLP

(57) ABSTRACT

The present disclosure relates generally to the manufacturing of semiconductor devices, and more particularly to semiconductor manufacturing using a vacuum chamber. In one example, a method for semiconductor manufacturing includes: providing a photoresist layer for a wafer; removing solvent residues from the photoresist layer by using a vacuum chamber; and exposing the wafer.

29 Claims, 10 Drawing Sheets

SYSTEM AND METHOD FOR MANUFACTURING SEMICONDUCTOR DEVICES USING A VACUUM CHAMBER

BACKGROUND

The present disclosure relates generally to the manufacturing of semiconductor devices, and in some embodiments, to a photolithography process.

Since the inception of the semiconductor industry, photolithography has been used for forming the components of integrated circuits. In operation, light beams pass through a mask, which has been patterned with a magnified image of the relevant integrated circuits. The light beams are then focused by a projection lens onto a wafer, resulting in an image of the integrated circuits in the photoresist, which performs the critical function of precise pattern formation.

However, a number of factors, such as solvent residues and undesirable liquid, may adversely affect the performance of the photolithography process, and especially the performance of the photoresist. In one example, solvent residues in photoresist may adversely contaminate the projection lens, especially in the case of wet lithography.

In a second example, following the deposition of a top anti-reflective coating (TARC) layer, the wafer is baked to reduce the solvent residues in the TARC. However, the additional baking process may undesirably alter the process window of the photoresist.

In a third example, water, which is interposed between the mask and the photoresist in wet lithography, may penetrate the photoresist and cause the photoresist to swell. As a result, patterns created in the photoresist may become altered.

Therefore, it is desirable to improve the photolithography process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
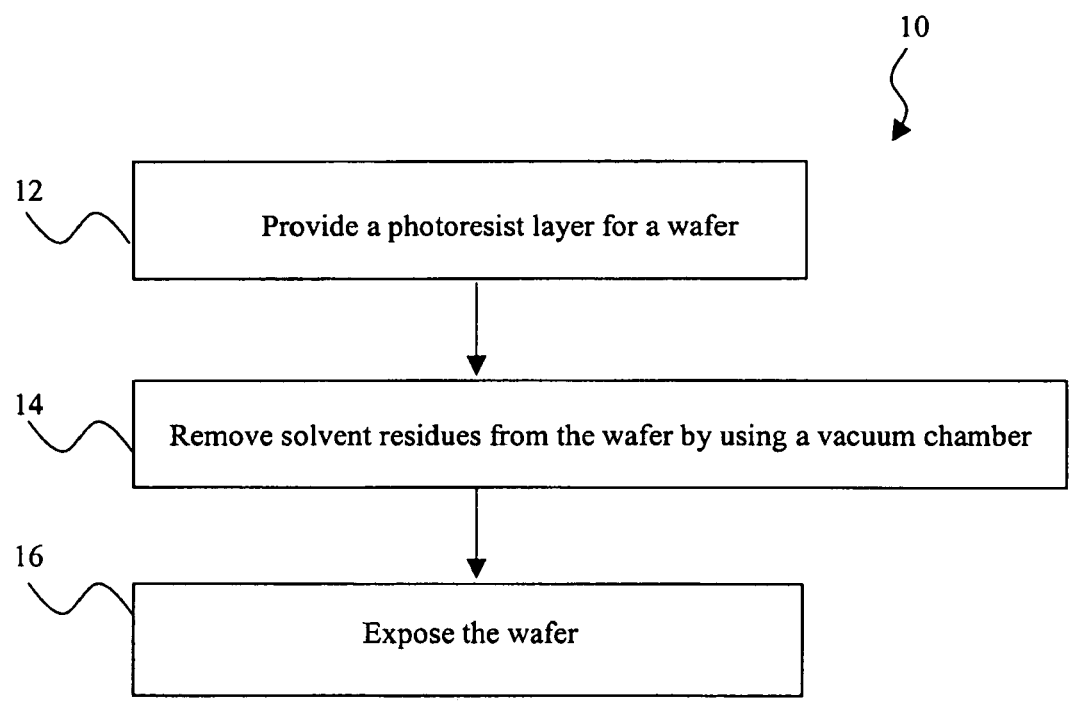
FIG. 1 illustrates a method of semiconductor manufacturing for implementing one or more embodiments of the present invention.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Furthermore, although the present discussion is directed to a semiconductor photolithography process, the present invention can also be used in other processes.

The present disclosure provides several different embodiments, all of which are, for the sake of example, directed to improving a photolithography process. In some embodiments, such as those discussed below with reference to FIGS. 2, 3a-3b and 4, one or more vacuum chambers may be utilized to remove solvent residues from photoresist layers. In other embodiments, such as those discussed below with reference to FIGS. 5-6, one or more vacuum chambers may be utilized to remove solvent residues from TARC layers. In still other embodiments, such as those discussed below with reference to FIG. 7, one or more vacuum chambers may be utilized to remove liquid from wet lithography.

Referring now to FIG. 1, in the present embodiments, a semiconductor photolithography method 10 may be utilized in the manufacturing of a variety of semiconductor devices (with or without the damascene technology), such as memory devices (including but not limited to a static random access memory (SRAM)), logic devices (including but not limited to a metal-oxide semiconductor field-effect transistor (MOSFET)), and/or other devices. The method 10 may be applied to either dry lithography or wet lithography.

For the sake of the present discussion, execution begins at step 12, which provides a photoresist layer for a wafer. At step 14, solvent residues are removed from the wafer by using a vacuum chamber. At step 16, the wafer is exposed and the lithographic process is completed. One or more of the steps of the method 10 can benefit from different embodiments of the present invention.

Figure 2:
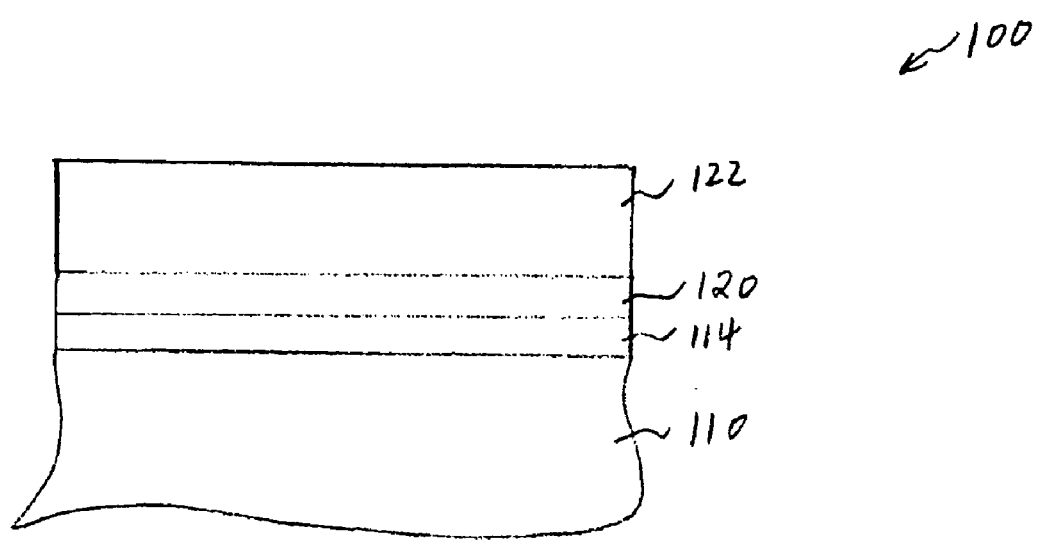
FIG. 2 illustrates a partial semiconductor device for implementing one or more embodiments of the present invention.

Referring now to FIG. 2, shown therein is a wafer 100 that can benefit from different embodiments of the present invention. The wafer 100 includes a substrate 110, a dielectric layer 114, a BARC layer 120, and a photoresist layer 122. The substrate 110 may include one or more insulator, conductor, and/or semiconductor layers. For example, the substrate 110 may include an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Further, the substrate 110 may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The substrate 110 may also or alternatively include a multiple silicon structure or a multilayer compound semiconductor structure.

A dielectric layer 114 may be deposited on the surface of the substrate 110. The dielectric layer 114 may be formed by chemical vapor deposition (CVD), plasma-enhanced CVD (PECVD), physical vapor deposition (PVD), atomic layer deposition (ALD), spin-on coating and/or other processes. The dielectric layer 114 may be an inter-metal dielectric (IMD), and may include low-k materials, silicon dioxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, and/or other materials.

The BARC layer 120 may be deposited over the dielectric layer 114 by a variety of techniques, including but not limited to spin-on coating, PVD, CVD, and/or other processes.

The BARC layer 120 may serve the function of reducing the intensity reflection coefficient of the substrate 110. In one example, the BARC layer 120 may absorb the light that inadvertently penetrates the bottom of a photoresist layer (not shown). To perform the light absorption, the BARC layer 120 may include a material with a high extinction coefficient, and/or considerable thickness. On the other hand, a high coefficient of the BARC layer 120 may lead to the high reflectivity of the BARC layer, which counters the effectiveness of the BARC layer 120. Accordingly, it is contemplated that the BARC layer 120 may possess a coefficient value at approximately between about 0.2 to about 0.5, and may possess a thickness of about 200 nm. However, it is noted that other ranges of coefficient values and thickness are also contemplated by the present disclosure.

In another example, an index matching approach may be adopted for the BARC layer 120. In that case, the BARC layer 120 may include a material with a refraction index and thickness that match those of the light used a subsequent process. In operation, once the light strikes the BARC layer 120, a portion of the light is reflected therefrom. Meanwhile, another portion of the light enters the BARC layer 120 and is transformed into a light with a shifted phase, which interferes with the first portion of the light that is reflected from the BARC layer 120, resulting in the reduction of the light reflectivity.

It is contemplated that the BARC layer 120 may employ both the light absorption and index matching approaches to achieve the desired results. In some instances, the BARC layer 120 may simply remain over the dielectric layer 114 and serve as a diffusion barrier for the wafer 100, as the removal of the BARC layer 120 may be difficult to accomplish.

The BARC layer 120 may include organic or inorganic materials. In one embodiment, the BARC layer 120 may include one or more materials, such as TiN, silicon oxynitride, silicon nitride and/or any suitable materials procured from suppliers such as Hitachi, Shipley, Brewer Science, Clariant, and Tokyo Ohka.

In furtherance of the example, a photoresist layer 122 may be deposited over the BARC layer 120. The photoresist layer 122 may be formed by spin-on coating and/or other processes. In operation, a photoresist solution is dispensed onto the surface of the BARC layer 120, and the wafer 100 is spun rapidly until the photoresist solution is almost dry.

In one example, the photoresist layer 122 may include three components: a resin, which serves as a binder and establishes the mechanical properties of the photoresist layer 122; a photoactive compound; and a solvent, which maintains the liquid nature of the photoresist solution until it is applied to the wafer. In some embodiments, the solvent may include an inorganic material, an organic material, and/or other materials. In one example, the organic material may include PGMEA, PGME, butanol, and/or other materials.

Figure 3A:
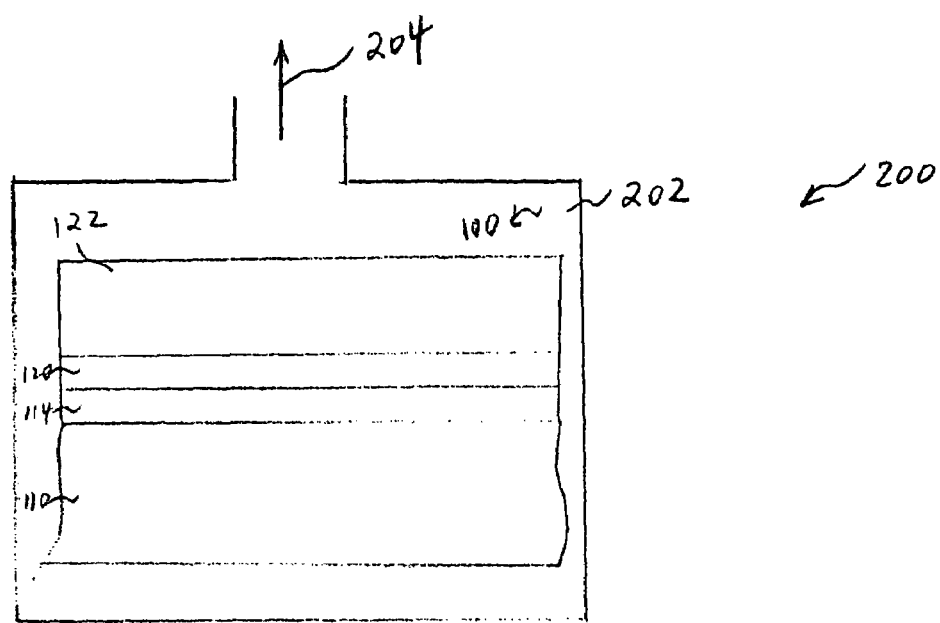
FIGS. 3a-3b illustrate vacuum chambers for processing partial semiconductor devices according to one or more embodiments of the present invention.
Figure 3B:
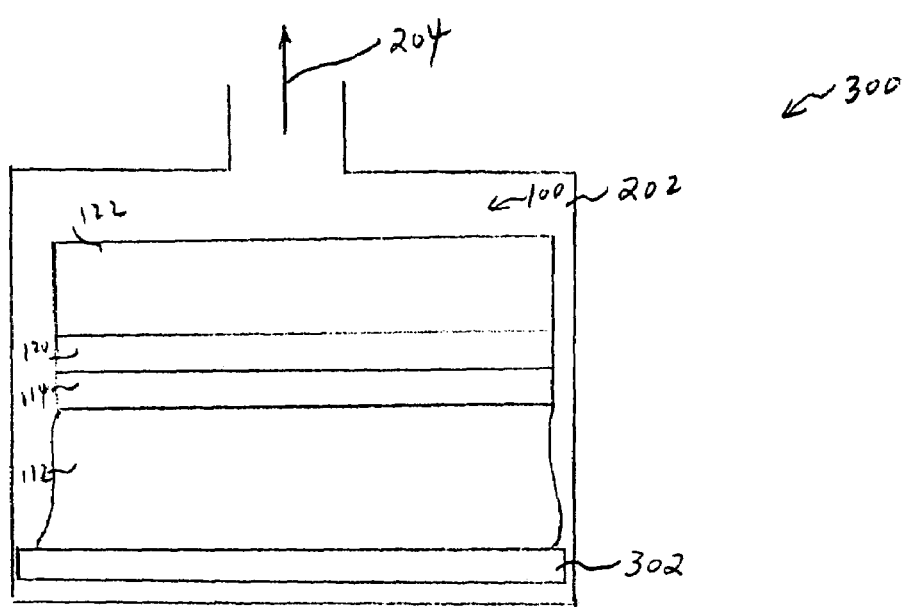

Referring to FIG. 3a, in one embodiment, the application of the photoresist layer 122 can be performed following a soft bake process (also known as pre-bake or post-apply bake). Referring to FIG. 3b, in another embodiment, the application of the photoresist layer 122 and the soft bake process may be performed simultaneously or at about the same time. The two embodiments will be described below.

Referring again to FIG. 3a, following the deposition of the photoresist layer 122 and a soft bake process, the wafer 100 may be placed in a vacuum chamber 202, which may be any vacuum chamber known in the art. As a result, solvent residues from the photoresist layer 122 may become evaporated, and thereafter removed from the wafer 100 as indicated by the arrow 204.

The vacuum chamber 202 may have a relatively low pressure, which may be below about 0.1 pascal. On the other hand, to ensure the efficiency of the system, the pumping speed for the vacuum chamber 202 may be relatively high, which may be greater than about 100 L/sec. However, it is noted that other pressure and pumping speed ranges are also contemplated by the present disclosure.

Referring now to FIG. 3b, in another embodiment, the vacuum chamber 202 may optionally include a hot plate 302. In that case, the soft bake process and step 14 may be performed in the vacuum chamber 202 simultaneously or at about the same time, thus reducing fabrication time. It is noted the soft bake process may be accomplished by any method known in the art. It is also contemplated that the vacuum chamber 202 may include an optional chilling plate (not shown) for cooling the wafer 100.

Pursuant to step 16 of the method 10, the wafer 100 may be exposed by methods known in the art to create an image in the photoresist layer 120.

Figure 4:
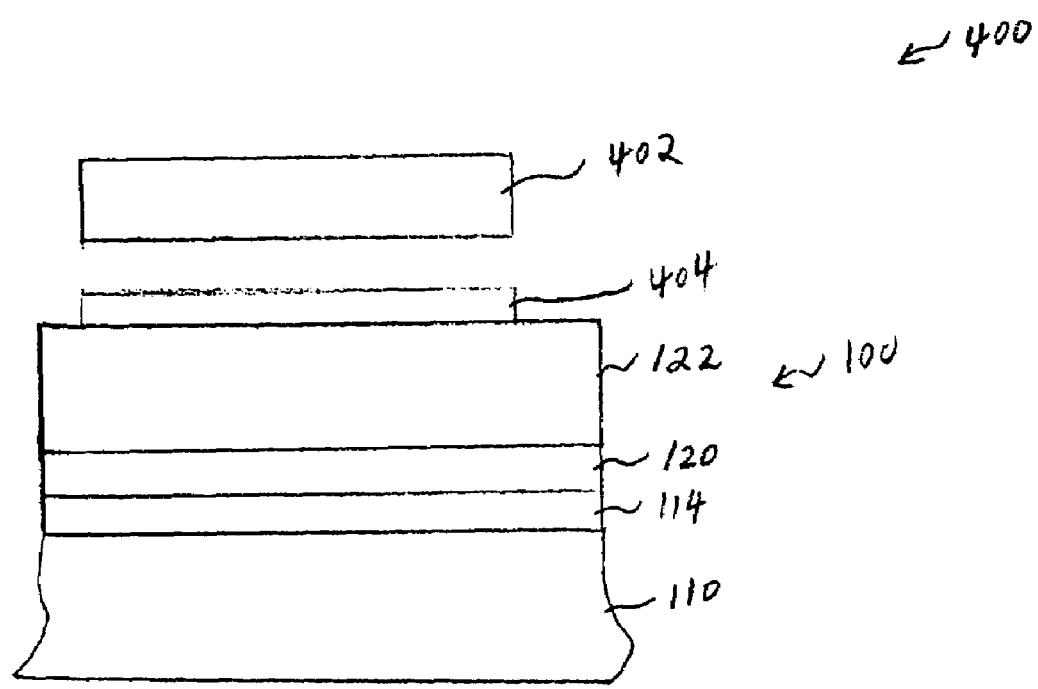
FIG. 4 illustrates a partial system for exposure according to one or more embodiments of the present invention.

Referring now to FIG. 4, in one embodiment, a simplified lithography system 400 includes a projection lens 402, an optional liquid film 404 (in the case of wet lithography), and the wafer 100.

The projection lens 402 is known in the art. Generally, it gathers light beams from a photo mask (not shown), and conveys them onto the wafer 100. The projection lens 402 may include fused silica (amorphous silicon dioxide) and/or any other suitable material known in the art.

In wet lithography, the liquid film 404 is interposed between the projection lens 402 and the wafer to cover at least a portion thereof. In one example, the liquid film 402 may be injected by an opening in the housing of the projection lens 402. The liquid film 404 may include water, doped water, $Cr_2$, a fluid having a PH value that is greater than 7, a fluid having a refractive index that is greater than 1, and/or other substance. It is contemplated that the liquid film 404 may be omitted in the case of dry lithography.

Following exposure, a post-exposure baking process and other steps (not shown) are applied to the wafer 100 to form a complete semiconductor device.

Figure 5:
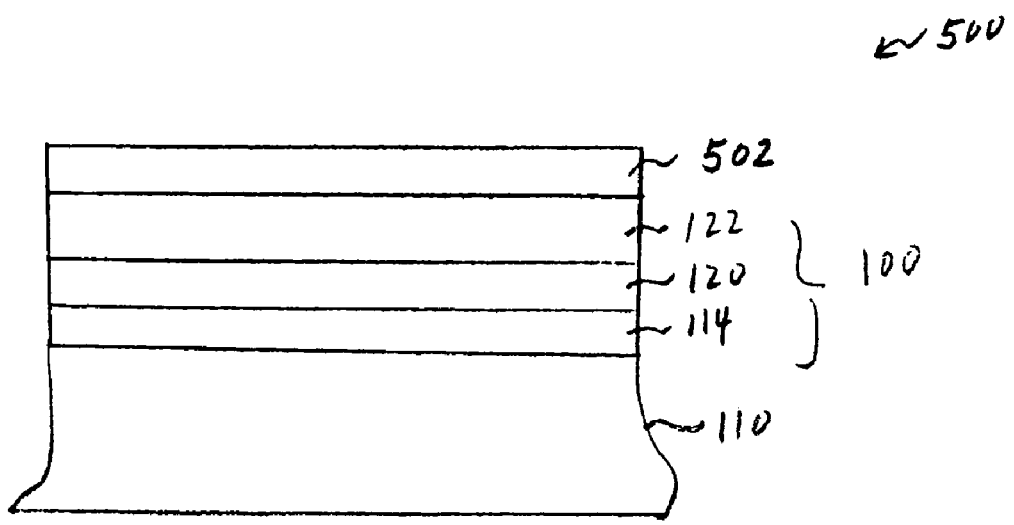
FIG. 5 illustrates a partial semiconductor device according to one or more embodiments of the present invention.

Referring now to FIG. 5, another group of embodiments include removing solvent residues from the TARC layer by using a vacuum chamber. In the following discussion, a wafer 500 includes the wafer 100 of FIG. 2 along with a TARC layer 502.

The TARC layer 502 functions similarly to an index-matched BARC layer (described above). The TARC layer 502 may be deposited over the wafer 100 by spin-on coating, and/or other suitable methods known in the art. The TARC layer 502 may include at least one solvent, which may include an inorganic material, an organic material, and/or other materials. In one example, the organic material may include PGMEA, PGME, butanol, and/or other materials.

Figure 6:
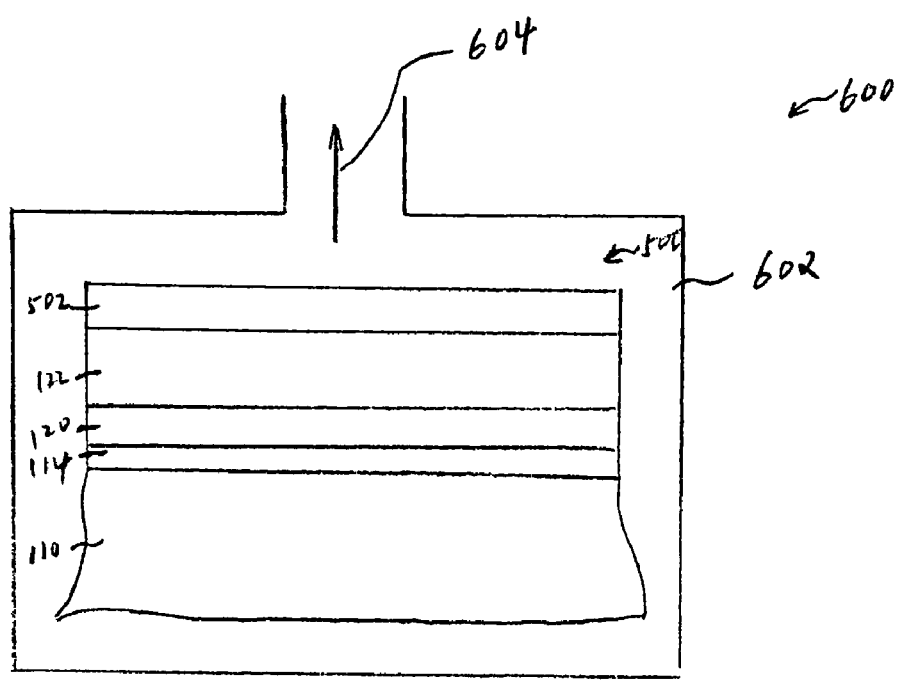
FIGS. 6-7 illustrate vacuum chambers for processing partial semiconductor devices according to one or more embodiments of the present invention.

Referring now to FIG. 6, in one embodiment, following the deposition of the TARC layer 502, the wafer 500 may be transferred to a vacuum chamber 602, which may be identical or similar to the vacuum chamber 202 of FIG. 3a. The vacuum chamber 602 may be used to remove solvent residues in the TARC layer 502 by directing the evaporated solvent toward the direction indicated by the arrow 604.

It is contemplated that the vacuum chamber 602 may also be used to remove solvent residues in the photoresist layer 122. It is further contemplated that the vacuum chamber 602 may include an optional hot plate and/or chilling plate for heating and/or cooling the wafer 500.

Figure 7:
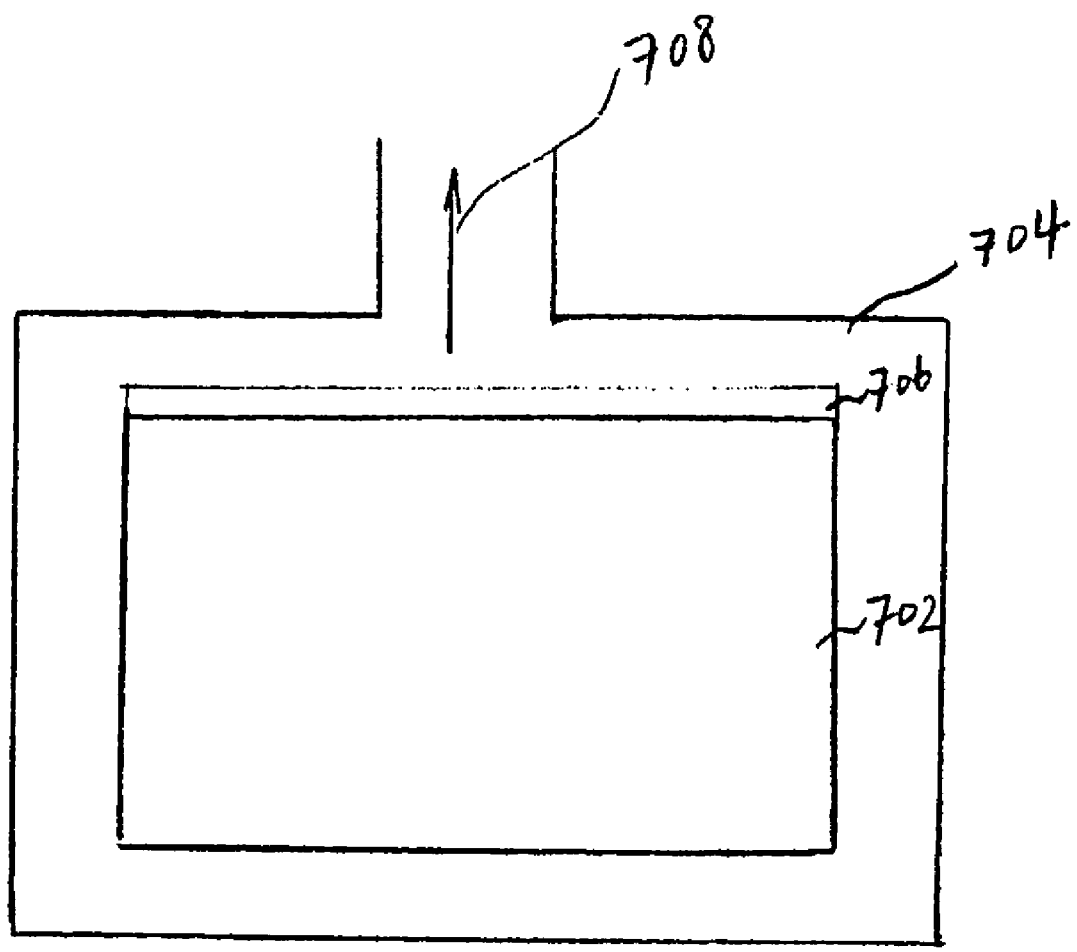

Referring now to FIG. 7, another group of embodiments include removing liquid from the wafer by using a vacuum chamber. Following the exposure of a wafer 702 (which may be similar to the wafer 100 of FIG. 2 or the wafer 500 of FIG. 5) by wet lithography, the wafer 702 may be transferred to a vacuum chamber 704. As a result, a liquid film 706 for the wet lithography and any residue thereof may become evaporated and thereafter removed from the wafer 702 as indicated by the arrow 708.

Figure 8:
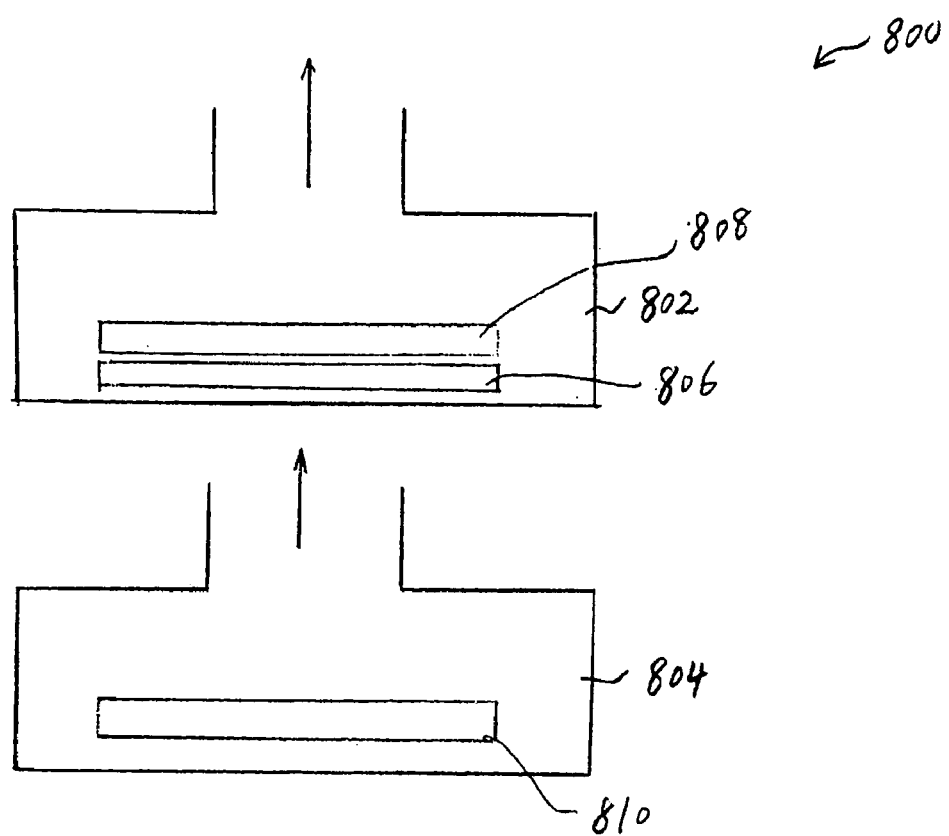
FIG. 8 illustrates a plurality of vacuum chambers for processing partial semiconductor devices according to one or more embodiments of the present invention.

Referring to FIG. 8, in one example illustrated in the top half of the figure, the vacuum chamber may optionally include a hot plate and/or a chilling plate for heating and/or cooling the wafer. In a second example, a plurality of wafers 806 and 808 may be processed simultaneously within a vacuum chamber 802. In a third example, a plurality of vacuum chambers 802 and 804 may be simultaneously employed in production to increase throughput.

Figure 9:
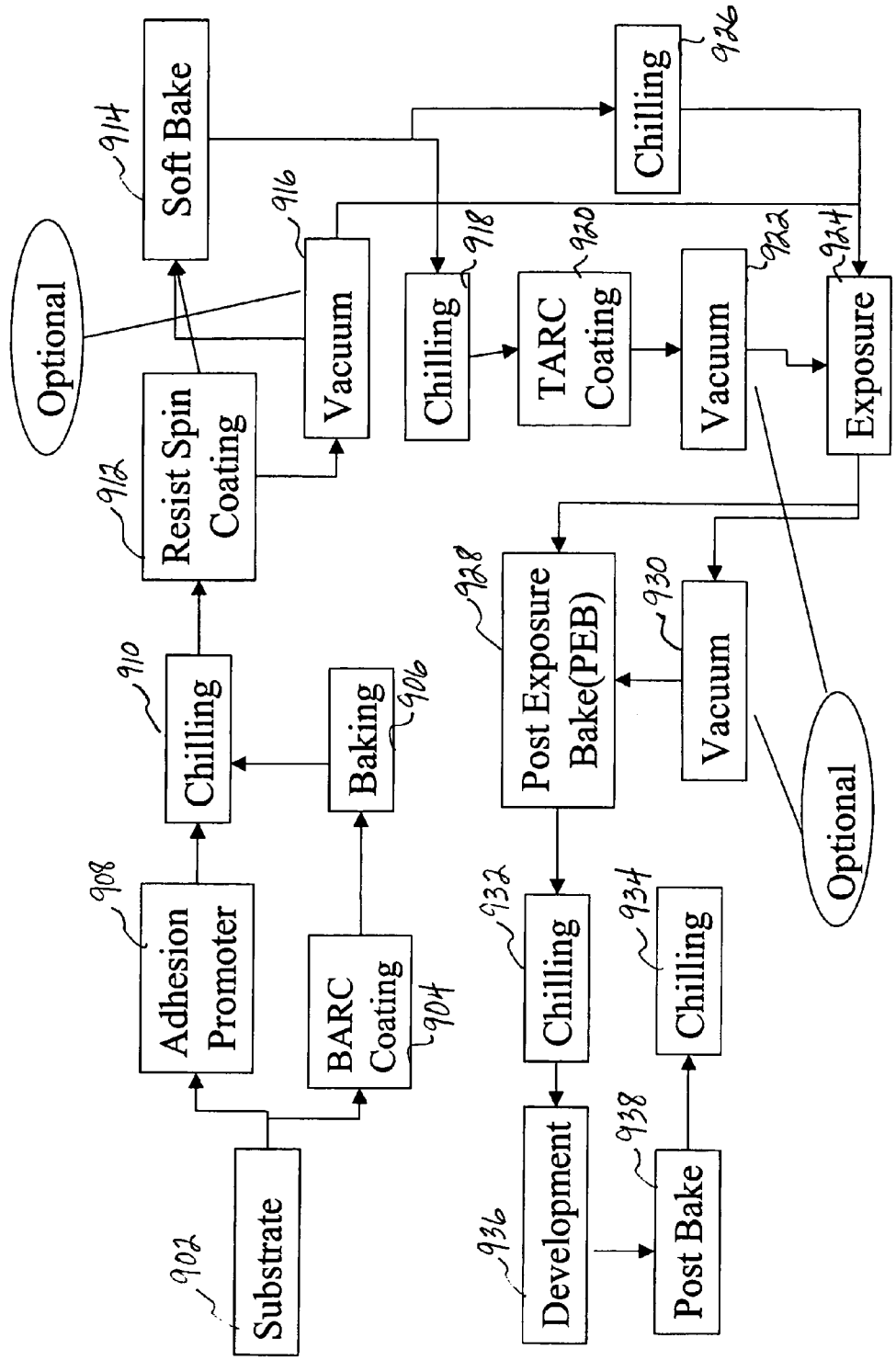
FIG. 9 illustrates a plurality of vacuuming steps for semiconductor fabrication according to one or more embodiments of the present invention.

Referring now to FIG. 9, in another embodiment, different configurations can be grouped and/or combined in various sequences to create a larger processing system 900. Since the steps illustrated in FIG. 9 have already be described above or are known in the art, they will only be briefly described herein. In this illustration, a wafer may include a substrate 902, and may undergo a BARC coating step 904 and a baking step 906 prior to a chilling step 910. In addition, an adhesion promoter 908 may be adopted for purposes of serving as an adhesion layer and/or treating the wafer. Thereafter, a resist spin coating step 912 may be employed prior to a soft bake step 914. Optionally, a vacuum chamber 916 may be used to remove solvent residues in the wafer prior to the soft bake step 914. Following a chilling step 918, a TARC coating process 920 may be applied to the wafer, and an optional vacuum chamber 922 may be used to remove solvent residues from the wafer. It is contemplated that a chilling step 926 may be adopted prior to an exposure step 924. Following the exposure of the wafer, an optional vacuum chamber 930 may be used to remove solvent residues and/or liquid from wet lithography. Thereafter, a post exposure bake step 928 and a chilling step 932 may be applied to the wafer prior to a development step 936. Following the development of the wafer, a post bake process 938 and a chilling step 934 may be applied to the wafer. It is contemplated that many of the steps in FIG. 9 are optional, and that additional step(s) that are not illustrated therein may also be included. It is further contemplated that the arrows in FIG. 9 are for illustration purposes only, and do not represent the order under which the steps of FIG. 9 must be performed. In fact, the order of performing many of the steps of FIG. 9 may be altered.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A method for semiconductor manufacturing, comprising:
    providing a photoresist layer for a wafer;
    soft-baking the photoresist layer outside a vacuum;
    placing the wafer with the pre-baked photoresist layer in a vacuum chamber;
    removing solvent residues from the photoresist layer by using the vacuum chamber; and
    exposing the wafer.

2. The method of claim 1 wherein the exposing is accomplished by wet lithography.

3. The method of claim 1 wherein the exposing is accomplished by dry lithography.

4. The method of claim 1 wherein the vacuum chamber comprises a hot plate for the soft baking, and wherein both the soft baking and the removing are applied to the wafer at about the same time.

5. The method of claim 1 wherein the solvent residues comprise an inorganic solvent.

6. The method of claim 1 wherein the solvent residues comprise an organic solvent.

7. The method of claim 1 wherein the solvent residues comprise PGMEA.

8. The method of claim 1 wherein the solvent residues comprise PGME.

9. The method of claim 1 wherein the solvent residues comprise butanol.

10. The method of claim 1 wherein the vacuum chamber is for simultaneously removing solvent residues from a plurality of wafers.

11. The method of claim 1 wherein the vacuum chamber comprises a hot plate for heating the wafer.

12. The method of claim 1 wherein the vacuum chamber comprises a chilling plate for cooling the wafer.

13. The method of claim 1 wherein the removing is applied to the wafer immediately following the providing.

14. The method of claim 1 wherein the removing is applied to the wafer immediately prior to the exposing.

15. The method of claim 1 further comprising:
    providing a top anti-reflective coating (TARC) layer over the photoresist layer; and
    removing solvent residues from the TARC layer by using the vacuum chamber.

16. The method of claim 15 wherein the exposing is accomplished by wet lithography.

17. The method of claim 15 wherein the exposing is accomplished by dry lithography.

18. The method of claim 15 further comprising removing solvent residues from the photoresist layer by using the vacuum chamber.

19. The method of claim 15 wherein the solvent residues comprise an inorganic solvent.

20. The method of claim 15 wherein the solvent residues comprise an organic solvent.

21. The method of claim 15 wherein the solvent residues comprise PGMEA.

22. The method of claim 15 wherein the solvent residues comprise PGME.

23. The method of claim 15 wherein the solvent residues comprise butanol.

24. The method of claim 15 wherein the vacuum chamber is for simultaneously removing solvent residues from a plurality of wafers.

25. The method of claim 1 wherein exposing the wafer includes:

exposing the wafer by wet lithography wherein a liquid is interposed between a projection lens and the wafer;

removing liquid from the wafer by using a vacuum chamber; and providing post exposure baking to the wafer.

26. The method of claim 25 wherein the liquid comprises water.

27. The method of claim 25 wherein the liquid comprises doped water.

28. The method of claim 25 wherein the liquid is removed using a vacuum chamber different from the vacuum chamber used to remove the solvent residues.

29. The method of claim 1 wherein the solvent residues are organic solvent residues.

* * * * *